United States Patent [19]

Trenkler et al.

[11] Patent Number: 4,890,058
[45] Date of Patent: Dec. 26, 1989

[54] ARRANGEMENT FOR MEASURING THE SLIP OF ELECTRIC INDUCTION MOTORS

[75] Inventors: Gerhard Trenkler, Brunswick; Reinhard Wedekind, Hamburg; Reinhard Maier, Herzogenaurach, all of Fed. Rep. of Germany

[73] Assignee: Siemens Aktiengesellschaft, Berlin and Munich, Fed. Rep. of Germany

[21] Appl. No.: 252,761

[22] Filed: Oct. 3, 1987

[30] Foreign Application Priority Data

Oct. 8, 1987 [DE] Fed. Rep. of Germany .... 3734971

[51] Int. Cl.[4] .............................................. G01R 31/02
[52] U.S. Cl. ............................ 324/158 MG; 318/490; 340/648
[58] Field of Search ................ 324/158 MG; 318/490; 340/648; 361/23

[56] References Cited

U.S. PATENT DOCUMENTS 2,654,860 10/1953 Lewis ................................... 318/490
4,123,009 10/1978 Kilpinen ....................... 324/158 MG
4,562,396 12/1985 Espelage et al. ..................... 318/809

FOREIGN PATENT DOCUMENTS

| 181775 | 5/1986 | European Pat. Off. |
| 1812926 | 8/1969 | Fed. Rep. of Germany ...... 324/158 MG |
| 2834257 | 2/1980 | Fed. Rep. of Germany ...... 324/158 MG |
| 3234683 | 3/1984 | Fed. Rep. of Germany . |
| 3711976.1 | 12/1986 | Fed. Rep. of Germany . |
| 2555317 | 5/1985 | France . |
| 449770 | 1/1968 | Switzerland . |

OTHER PUBLICATIONS

"Die elektrische Messung von Drehzahl und Wikelgeschwindigkeit", Verlage E. Geyer Bad Worishofen (1974).
"Identifikation linearer zeitvarianter SYsteme und ihre Anwendung auf Induktionsmachinen", Dr. Franz Hillenbrand (1982).
"FFT Schnelle Fourier–Transformation", E. Oran Brigham (1985).
"Adaptive Signal Processing", Bernard Widrow et al.
European Search Report, 08/04/88.
"Steady State Characteristics of a Torque and Speed Control System of an Induction Motor Utilizing Rotor Slot . . . ", Isida et al., 8292 I.E.E.E. Transactions on Power Electronics, PE-2 (Jul. 3, 1987).
"Leakage Field Changes of an Induction Motor as Indication of Nonsymmetric Supply", Erlicki et al., I.E.E.E. Transactions on Industry and General Application, vol. IGA-7, No. 6, Nov./Dec. 1971.

Primary Examiner—Ernest F. Karlsen
Attorney, Agent, or Firm—Kenyon & Kenyon

[57] ABSTRACT

An arrangement for measuring the slip of electric induction motors determines the relative measure of the difference between rotary field speed and rotor speed of induction motors by utilizing the nonlinearity effects of the magnetization characteristics of ferromagnetic materials. Slip-proportional current and/or voltage signals are detected at the terminals of the induction motor. By suitable processing of these slip-proportional signals, such as frequency conversion and filtering, a frequency-proportional measure of the slip is provided which is then subjectable to measuring or further processing.

6 Claims, 1 Drawing Sheet

ARRANGEMENT FOR MEASURING THE SLIP OF ELECTRIC INDUCTION MOTORS

FIELD OF THE INVENTION

The present invention relates to an arrangement for measuring the slip of single or multiple phase electric induction motors, and more particularly, to a measuring and processing arrangement which directly indicates the slip of induction motors in their operating range or makes it accessible for further processing.

BACKGROUND OF THE INVENTION

Slip is a relative measure of the difference between rotary field speed and rotor speed and hence is an important operational parameter for induction motors.

Arrangements are known which measure the rotational speed (Trenkler, G. "Die elektrische Messung von Drehzahl und Winkelgeschwindigkeit", Verlag E. Geyer, Bad Worishofen, 1974, in particular pages 36 and 37) so that the slip can be calculated. For an inverter supply of a motor, it is known to calculate the slip by means of a slip computer from the motor current, motor flux, and ignition angle (German Published Unexamined Patent Application 35 23 619). Also known are computer-assisted methods of estimating slip (Hillenbrand, F., "Identification of linear time-invariant systems and their application to induction motors", Dissertation, TU Berlin 1982, pages 149-157). Another known method for measuring slip is the provision of a separate measuring motor (Swiss Patent 449,770) having an air gap in which Hall probes are disposed. Further, to determine the rotational speed in universal motors utilizing effective harmonics, application of the Fast Fourier Transform is known (French Patent 25 55 317).

The above known arrangements and methods require speed sensors or are suitable only for certain motor types and circuit variants, or else they require precise prior knowledge concerning the measured object. The cost involved in the evaluation electronics and software is usually considerable.

To provide rotational speed determination, a measuring arrangement was proposed (in German Patent Application 37 11 976.1 of Apr. 9, 1987), which determines the time responses of the voltages at the electrical connections and/or the currents through the electrical connections of the motor.

The problem presented by the prior art is to provide an arrangement which permits in a universal and simple manner the measurement of the slip of electric induction motors.

SUMMARY OF THE INVENTION

The above and other problems are solved by the present invention which provides an arrangement for measuring the slip of an electric induction motor having at least one phase, the arrangement comprising a level-adapted preliminary filter stage coupled to the motor. This stage is supplied with the current signals and/or the voltage signals which are generated by the motor, these current signals and voltage signals having a frequency proportional to the slip. A means for signal convolution a frequency range at either a power supply frequency or its harmonics is coupled to an output of the level-adapted preliminary filter stage. A filter is coupled to an output of the means for signal convolution, while a display and evaluating unit is coupled to an output of the filter.

In another embodiment of the invention, a converter is coupled between the motor and the level adapted preliminary filter stage. This converter senses from at least one phase of the motor the slip-proportional current signals that are generated by the motor.

In still another embodiment of the invention, the neutral points of the power supply and the motor are not connected, and the multi-phase motor is in star connection. The level-adapted preliminary filter stage is coupled to both neutral points so as to pick up the slip-proportional voltage signals.

The embodiments of the invention described above provide an arrangement for a simple measurement of the slip of electric induction motors.

DETAILED DESCRIPTION

Before describing the embodiments of the invention, the following is an explanation of the principle on which the invention is based.

In induction motors, ferromagnetic materials are used that have magnetization characteristics which are non-linear in the normal operating range, that is, outside saturation. A multiplicative linkage of flux components of slip and power supply frequency occurs, resulting in combination frequencies which are detectable by induction at the terminals of the motor as current and/or voltage signals. In the signal spectrum these components appear as frequency groups at once or twice the distance of the slip frequency about the power supply frequency as well as their odd-numbered and even-numbered harmonics. The amplitude of these components is dependent, among other things, on the magnet material and degree of saturation. The amplitude of the components is normally very small (about −60 to −90 dB), compared to the power supply parameters. Since the flux components are very close to the power supply frequency or its harmonics, especially when the slip is small, direct selection and evaluation of these components is not possible.

What is possible, however, is the selection of one or more suitable frequency groups. Undesirable signal components, such as rotor slots harmonics, are sufficiently suppressed by this selection. When the slip-proportional components are shifted by convolution in the frequency range into an undisturbed frequency band, e.g. the base band, they can be obtained by simple filtering due to the large relative frequency distance from interference components existing in this undisturbed band. The slip-proportional components can then be displayed directly and/or further processed.

Thus, for example, a frequency group with components at the distance of twice the slip frequency $2 \times fs$ can be selected. After convolution and filtering, a frequency counter can then be used for displaying the slip. For a 50 Hz power supply, the slip s is then indicated directly as a percentage, independently of the number of pole pairs of the motor, since $2 \times fs = 2 \times s \times 50 = 100 \, s = s(\%)$.

Figure 1:
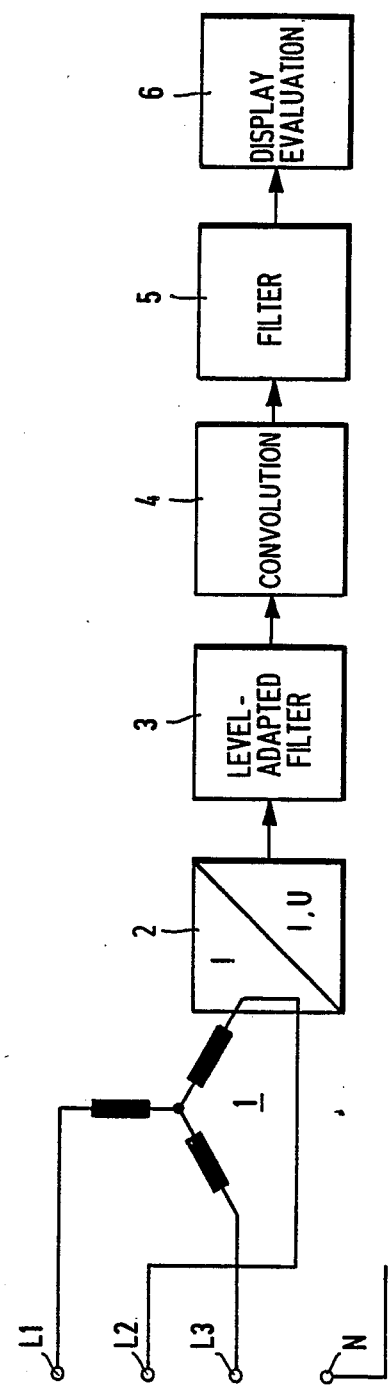
FIG. 1 is a block diagram of an embodiment of the present invention which uses a current signal.

In the embodiment of the invention illustrated in FIG. 1, the raw signal, comprising the geometric sum of all components delivered by the power supply and generated by the motor, is obtained from a single or multiphase induction motor 1 by at least one converter 2. This raw signal is supplied to a level-adapted preliminary filter 3, preferably with a band pass characteristic. A subsequent convolution 4 (see E. Oran Brigham, "FFT Fast Fourier-Transformation", pages 68 to 94, 2nd edition, R. Oldenbourg Verlag Munich Vienna 1985) is done, for example, by simple squaring or synchronous rectification with the power supply frequency. For this convolution known devices such as parabolic function networks, multipliers or ring modulators may be used. Undesired frequency components of the convolved signal are suppressed by a filter 5. As the amplitude of the useful signal increases with increasing slip because of the also increasing reaction of the rotor, an almost constant output signal is generated by suitable selection of the properties of the filter 5. Such filters are known for example from the publication by Stearns, "Adaptive Signal Processing" Prentice Hall, Inc., Englewood Cliffs, NJ 07632, pages 316 et seq. The selection of the properties of the filter 5 is a simple matter for one of ordinary skill in the art.

If the filter 5 is, for example, a low-pass filter, in most cases level control and limiting devices are dispensable if a proper selection of the cut-off frequency and edge steepness is made. Thus, the output signal is able to be supplied to a display and/or evaluating unit 6 directly.

Figure 2:
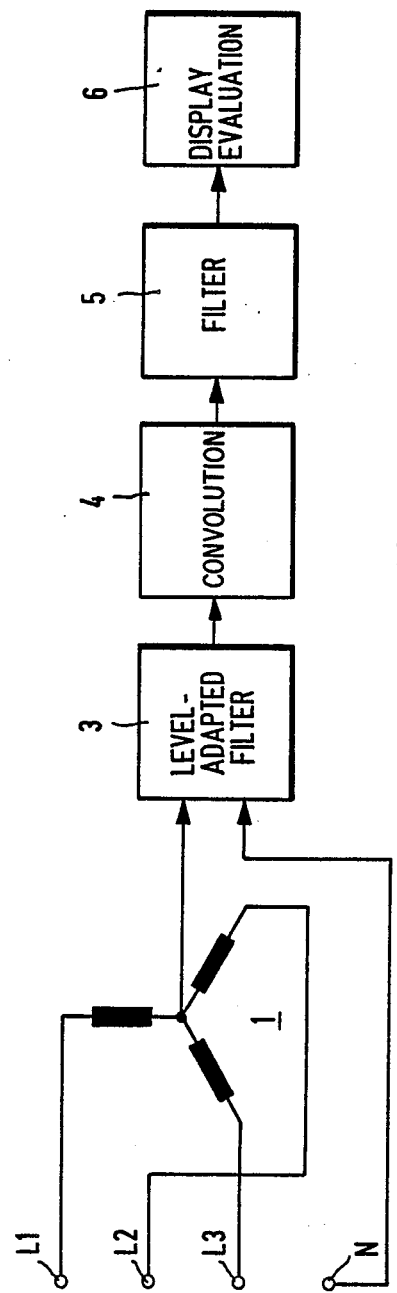
FIG. 2 is a block diagram of another embodiment of the present invention which uses a voltage signal.

FIG. 2 illustrates another embodiment for obtaining the raw signal. If a three-phase motor 1 is operated with a star connection, the converter 2 is not needed if the neutral point of the motor is not connected with the neutral point of the power supply. Since the useful signal components do not cancel each other out because of lack of symmetry, they are available directly as voltage signals against the neutral point of the power supply. The further processing for the embodiment is the same as that shown in FIG. 1.

What is claimed is:

1. An arrangement for measuring the slip of an electric induction motor having at least one phase, comprising: a level-adapted preliminary filter stage coupled to said motor so as to be supplied at least one of current signals and /or voltage signals generated by said motor, said current and/or voltage signals having a frequency proportional to the slip; means for signal convolution in a frequency range at at least one of a power supply frequency and/or its harmonics, said means for signal convolution being coupled to an output of said level-adapted preliminary filter stage; a filter coupled to an output of said means for signal convolution and at least one of a display unit and/or an evaluating unit coupled to an output of said filter.

2. The arrangement according to claim 1, wherein said filter having filter parameters selected such that it supplies at least one of said display unit and said evaluating unit with a substantially constant, slip-independent amplitude.

3. The arrangement according to claim 1, wherein said filter stage is supplied with a current signal having a frequency proportional to slip and further comprising a converter, coupled between said motor and said level-adapted preliminary filter stage, which senses from at least one phase of said motor said slip-proportional current signals generated by said motor.

4. The arrangement according to claim 3, wherein said filter having filter parameters selected such that it supplies at least one of said display unit and said evaluating unit with a substantially constant, slip-independent amplitude.

5. The arrangement according to claim 1, wherein said motor is a multi-phase induction motor that is star connected to a power supply with no connection between a neutral point of said motor and a neutral point of said power supply, and said filter stage is supplied with a voltage signal having a frequency proportional to slip, and said level-adapted preliminary filter stage is coupled to said neutral points so as to pick up said slip-proportional voltage signals.

6. The arrangement according to claim 5, wherein said filter having filter parameters selected such that it supplies at least one of said display unit and said evaluating unit with a substantially constant, slip-independent amplitude.

* * * * *